United States Patent [19]

Kimura et al.

[11] 4,369,511

[45] Jan. 18, 1983

[54] SEMICONDUCTOR MEMORY TEST EQUIPMENT

[75] Inventors: Kenji Kimura, Saitama; Kohji Ishikawa, Funabashi; Naoaki Narumi, Tokyo, all of Japan

[73] Assignees: Nippon Telegraph & Telephone Public Corp.; Takeda Riken Kogyo Kabushiki Kaisha, both of Tokyo, Japan

[21] Appl. No.: 205,162

[22] Filed: Nov. 10, 1980

[30] Foreign Application Priority Data

Nov. 21, 1979 [JP] Japan .................................. 54-150899
Nov. 21, 1979 [JP] Japan .................................. 54-150900
Nov. 21, 1979 [JP] Japan .................................. 54-150904

[51] Int. Cl.³ ............................................. G01R 31/28
[52] U.S. Cl. ................................. 371/21; 324/73 R; 371/25; 371/27
[58] Field of Search ................. 371/21, 25, 27; 324/73 R; 364/900

[56] References Cited

U.S. PATENT DOCUMENTS

| | | | |
|---|---|---|---|
| 3,311,890 | 3/1967 | Waaben | 371/21 |
| 3,631,229 | 12/1971 | Bens | 371/21 |
| 3,751,649 | 8/1973 | Hart, Jr. | 371/21 |
| 3,962,687 | 6/1976 | Suzumura et al. | 371/21 |
| 4,293,950 | 10/1981 | Shimizu et al. | 371/27 |

OTHER PUBLICATIONS

J. McLeod, Pattern Processor Packs Hardware, Software Generators, Electronic Design, vol. 28, No. 23, Nov. 8, 1980, pp. 36, 37.

*Primary Examiner*—Charles E. Atkinson
*Attorney, Agent, or Firm*—Staas & Halsey

[57] ABSTRACT

A semiconductor memory test equipment which reads out a memory under test by an address from a pattern generator and compares the read-out data with an expected value by a comparator, and in which a block mask memory is read out by a portion of the address and the comparing operation of the comparator is inhibited by block mask data read out from the block mask memory. Pattern data for a pattern memory, which is read out by the abovesaid address to store data to be supplied to the comparator, are transferred as parallel data from a central processor and written in the pattern memory after conversion to serial data, and serial data read out from a defective address memory are inputted to the central processor after conversion to parallel data.

14 Claims, 21 Drawing Figures

SEMICONDUCTOR MEMORY TEST EQUIPMENT

BACKGROUND OF THE INVENTION

The present invention relates to a semiconductor memory test equipment which tests a semiconductor for correct write and read operations and, in case of a defect being detected, makes an analysis of the defect.

In semiconductor memory test equipment it is general practice to generate an address and write data from a pattern generator, access a memory under test by the address for writing therein the write data or reading out therefrom stored data, and compare the read-out data with expected value data, i.e. correct data, thereby testing the memory for correct write and read operations. Some of the semiconductor memory test equipment is arranged not only to decide whether the memory under test is non-defective or defective but also to make an analysis of a defect, such as the detection of the position and the cause of the defect, in the case of the memory being defective.

In the test of a semiconductor memory, there has been employed such a method that masks a particular bit of the memory test result from being provided, or that outputs the test result as a correct one regardless of the actual test result. Sometimes it is desired to test only a desired area of the memory under test as in the case where many defects exist in one area of the memory and only the other areas are tested, thus masking the area of many defects. In such a case, when selecting the test result of a desired area from the test results of all areas of the memory, a mistake may be made in the selection. Accordingly, if unnecessary areas are masked in advance, there is less possibility of making an error in the analysis of the test results. In the prior art, however, masking is performed by assigning the memory for each bit or address, so that in the case of masking a relatively wide area, the amount of data for masking, that is, what is called the mask data, increases. The mask data is stored in a mask memory which is read out by the same address as that for the memory under test, but when the amount of mask data is large, much time is required for transferring the mask data to the mask memory.

Accordingly, it will be very convenient if a particular block of the memory under test can be masked (block masking). In the case of such block masking, when one word is composed of a plurality of bits, a highly flexible masking operation can be performed for each bit of the word.

In the case where the memory under test is a read only memory, its expected value data is complex and difficult to obtain by a logic operation in many cases. To avoid this difficulty, it is customary in the art to prestore the expected value data as an expected value pattern in an expected value pattern memory and read it out by an address from a pattern generator to the memory under test to obtain the expected value data. To this end, the expected value data and the mask data are transferred to the expected value pattern memory and the mask memory respectively prior to the test. For the test of the memory, use is made of a complex test pattern so that defects may easily be found, and the same address is usually accessed a plurality of times in one test and the test pattern is long. As a consequence, the expected value pattern and the mask data pattern also become long, resulting in a relatively long time being required for the transfer. A semiconductor memory of a large storage capacity and high-speed operation has an operating cycle of, for example, about 20 nanoseconds, but the transfer of the expected value pattern or the mask data pattern from a central processor to the corresponding memory is approximately 1 microsecond per cycle, which is very slow in terms of the operation of a memory. Hence, the prior art method is disadvantageous in that the time for the transfer of the above data patterns is appreciably long as a whole.

Furthermore, for making an analysis of a defect, the memory under test is read out by an address from the pattern generator, and the read-out data is compared with the expected value data and then the comparison result is written in a defect address memory, using the same address as that for the memory under test. After the test, the defect address memory is read out and the data therefrom is inputted to the central processor for the defect analysis. Also in this case, however, since the operating cycle of the central processor is low in speed, much time is required especially when the memory under test has a large storage capacity.

SUMMARY OF THE INVENTION

It is an object of the present invention to provide a semiconductor memory test equipment which is capable of masking a desired block of a memory under test which is essentially free from the influence of defects originating from a memory area other than the particular area in which defect analysis is to be conducted.

Another object of the present invention is to provide a semiconductor memory test equipment which is capable of masking a specified block of a memory under test for particular bits of each word of the block, permitting highly flexible block masking.

Another object of the present invention is to provide a semiconductor memory test equipment in which patterns necessary for testing a memory, such as a mask pattern, an expected value pattern and so forth, can be written in pattern memories at high speed and in a short time.

Still another object of the present invention is to provide a semiconductor memory test equipment in which the stored content of a defect address memory can be inputted to a control section at high speed for making a defect analysis of a memory under test.

According to the present invention, a block mask memory is read out by one portion of an address for a memory under test and, by the block mask data read out from the block mask memory, the output from a comparator for comparing the read-out output from the memory under test and expected value data is inhibited. When one word of the memory under test is composed of a plurality of bits, the block masking is performed corresponding to each bit. In other words, the block mask data has the same bit length as the one-word bit length of the memory under test, and for each bit, the block mask data takes one of two values depending on whether masking is carried out or not. By the block mask data, such control is effected to inhibit the compared output for each bit of the comparator, or to provide a coincidence signal regardless of whether or not both inputs to the comparator actually coincide.

Moreover, prior to the test, various patterns such as the expected value pattern and the mask data are transferred to pattern memories from the control section formed as with a central processor. To this end, an address counter for accessing the pattern memory is provided. An address is set by the control section in the address counter and when it is supplied with a write command from the control section, the address is stepped by a predetermined number. In synchronism with the stepping of the address a write signal is provided from a write signal generator to the pattern memory. Further, pattern data are set in a parallel-serial converting section from the control section and, in synchronism with the stepping of the address, the parallel-serial converting section converts the parallel data to serial data for input as write data to the pattern memory.

After the test, the content of the defect address memory is transferred to the control section. In the present invention, an address counter for accessing the defect address memory is provided, which sequentially steps in response to a read command from the control section. In accordance with the content of the address counter, the defect address memory is read out and the read-out data for a plurality of addresses are converted by a serial-parallel converting section to parallel data for input to the control section. The address counter for the defect address memory can be used in common to the pattern memory. In this way, the transfer of the various pattern data to the pattern memory before the test and the data transfer from the defect address memory after the test are performed in the form of parallel data, that is, one transfer operation is carried out for a plurality of addresses instead of effecting one transfer operation for each address of the pattern memory and the defect address memory; accordingly, the transfer time can be reduced.

DETAILED DESCRIPTION OF THE PREFERRED EMBODIMENTS

Figure 1:
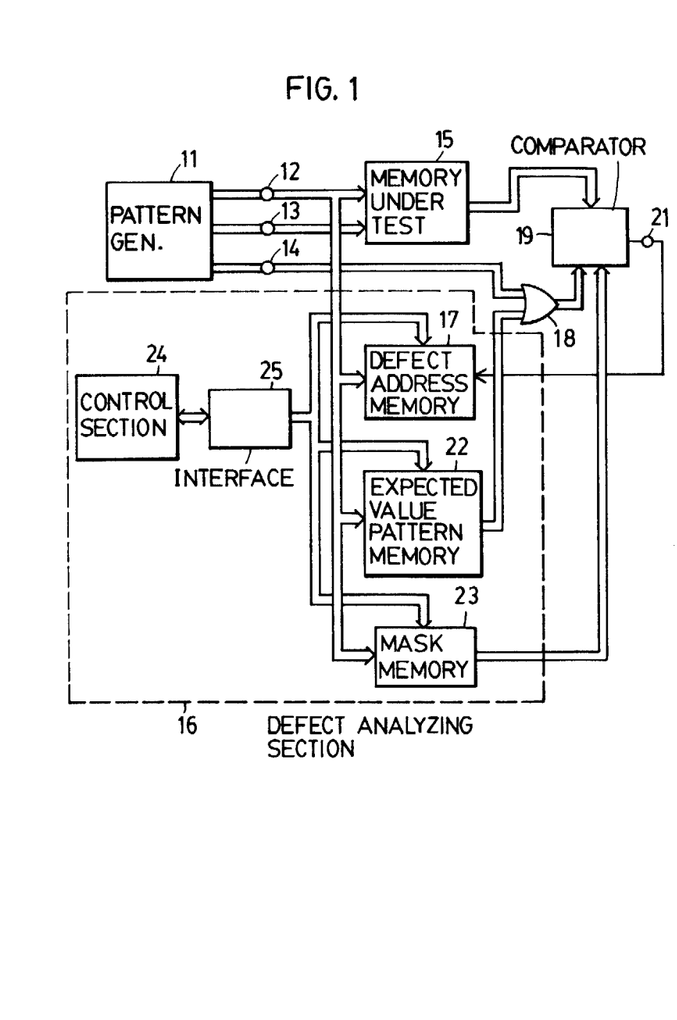
FIG. 1 is a block diagram illustrating the general arrangement of a semiconductor memory test equipment.

FIG. 1 illustrates the general arrangement of a semiconductor memory test equipment, in which a pattern generator 11 provides an address, write data and expected value data at its terminals 12, 13 and 14, respectively. By the address derived at the terminal 12 a memory under test 15 is accessed and, at the same time, a defect address memory 17 in a defect analyzing section 16 is accessed. The write data at the terminal 13 is written in the accessed part of the memory under test 15. After this, the memory 15 is accessed to read out therefrom data, which are compared, by a comparator 19, with the expected value data applied thereto from the terminal 14 via an OR circuit 18. When both data do not coincide, the comparator 19 derives at its output terminal 21 a non-coincidence output, which is stored in the defect address memory 17.

In the case where the memory under test 15 is a read only memory, it is difficult to generate the expected value data for the memory 15 by a logic operation. The expected value data are prestored in an expected value pattern memory 22 of the defect analyzing section 16 and the expected value pattern memory 22 is accessed by the address from the terminal 12 to read out the expected value data, which are supplied via the OR circuit 18 to the comparator 19. The defect analyzing section 16 includes a mask memory 23 for storing mask data and the mask memory 23 is accessed by the address from the terminal 12 to read out the mask data, which are provided to the comparator 19. In the case of masking being performed, even if non-coincidence is detected between both data, the comparator 19 is inhibited from providing its non-coincidence output and control is carried out which yields the same output as is produced when coincidence is detected. The expected value and the mask data are respectively transferred, prior to the start of a test, via an interface 25 to the expected value pattern memory 22 and the mask memory 23 from a control section 24 formed by a central processing unit (CPU). After completion of the test, the content of the defect address memory 17 is inputted to the control section 24, which analyzes the inputted data, following a predetermined procedure.

Figure 2:
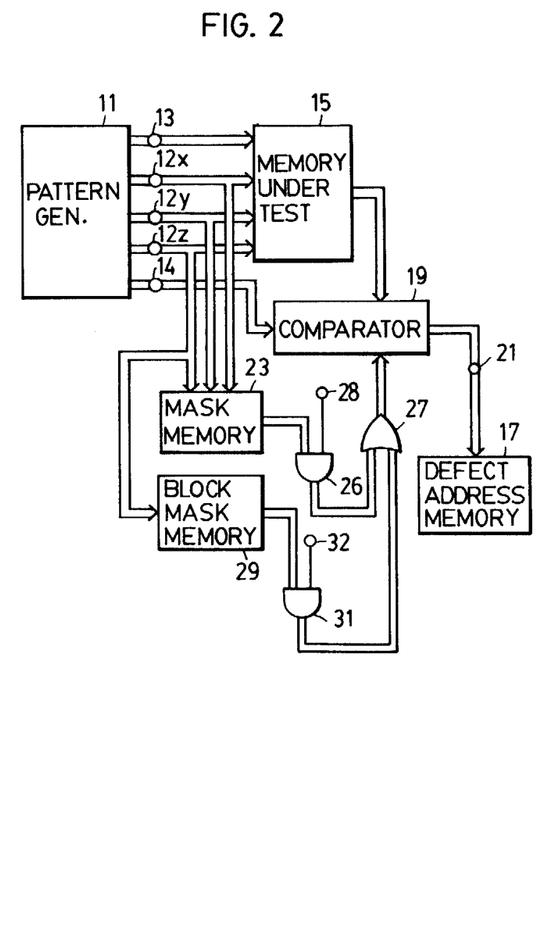
FIG. 2 is a block diagram showing one part of the semiconductor memory test equipment of the present invention.

FIG. 2 shows one part of the semiconductor memory test equipment of the present invention. In FIG. 2 the parts corresponding to those in FIG. 1 are identified by the same reference numerals. From terminals 12X, 12Y and 12Z of the pattern generator 11 are respectively provided X, Y and Z addresses to the memory under test 15 and these addresses are also applied to the mask memory 23. In the comparator 19 the data read out from the memory under test 15 and the expected value data from the terminal 14 are compared for each corresponding bit and when non-coincidence is detected, the comparator 19 derives an output at the terminal 21. The mask data read out from the mask memory 23 are supplied via an AND gate 26 and an OR circuit 27 to the comparator 19. By the mask data it is determined whether the result of comparison between the data read out from the memory under test and the expected value data is outputted or not; namely, the test equipment is arranged so that when the mask data exists, the comparison result is rendered inoperative. The AND gate 26 is provided for determining whether to output the mask data and the AND gate 26 is opened when a high level is provided to a terminal 28.

In the present invention a block mask memory 29 is provided, which is accessed by one part of the address derived from the pattern generator 11, in this example, the Z address from the terminal 12Z. The block mask memory 29 has stored therein mask data corresponding to each bit of each word. The output from the block mask memory 29 is provided via an AND gate 31 and the OR circuit 27 to the comparator 19. Whether or not the block masking is performed by the output from the block mask memory 29 is controlled dependent on whether or not the AND gate 31 is opened by applying a high level to a terminal 32.

Figure 3A:
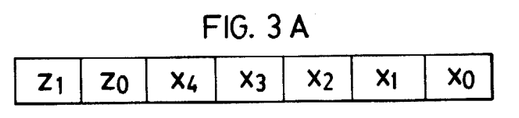
FIGS. 3A and 3B illustrate examples of an address configuration.
Figure 3B:
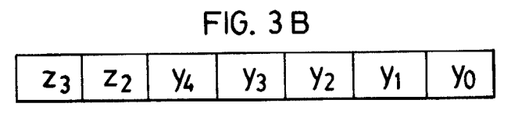

For instance, the memory under test 15 may have a 16K word by 4 bit configuration, which is divided into 16 blocks for each 1K words, and one of the 16 blocks is selected by the Z address. Accordingly, the Z address has four bits $z_0$ to $z_3$; the X address is composed of bits $x_0$ to $x_4$, $z_0$ and $z_1$, as shown in FIG. 3A; and the Y address is composed of bits $y_0$ to $y_4$, $z_2$ and $z_3$, as shown in FIG. 3B.

Figure 4A:
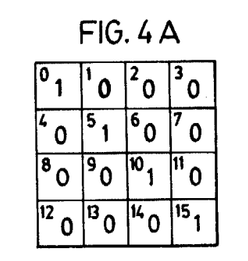
FIGS. 4A to 4D show examples of block masking.
Figure 4B:
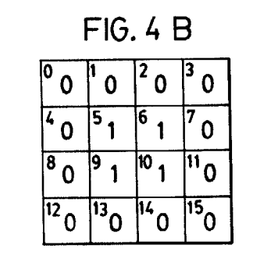
Figure 4C:
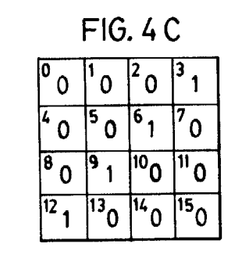
Figure 4D:
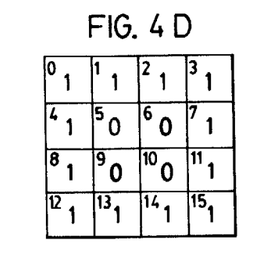

The addresses for accessing the block mask memory 29 are the Z address $z_0$ to $z_3$ from the terminal 12Z, as described previously, and by the addresses the memory under test 15 is divided into areas 0 to 15, one of which is selected. The block mask memory 29 has stored therein block mask data so that it can be determined whether or not block masking is performed for each bit of each word in the selected block. For example, as shown in FIG. 4A, the first bits of the respective words in the 0th, 5th, 10th and 15th ones of the blocks 0 to 15 into which the memory under test is divided for each 1K words, represented by "1," are masked and first bits of the words in the other blocks, represented by "0," are not masked. In connection with a second bit of each word, only the 5th, 6th, 9th and 10th blocks are masked, as shown in FIG. 4B. In a similar manner, in connection with third and fourth bits, different blocks are masked, as depicted in FIGS. 4C and 4D.

Accordingly, for instance, when the Z address assigns the 0th block, the block mask memory 29 outputs mask data "1," "0," "0," "1." Namely, the first bit of each word of the 0th block is masked; second and third bits are not masked; and a fourth bit is masked. When the Z address assigns the 1st block, only the fourth bit of each word of the block is masked, and the first, second and third bits are not masked. In this way, respective bits of each word of a selected block can be selectively masked.

Figure 5:
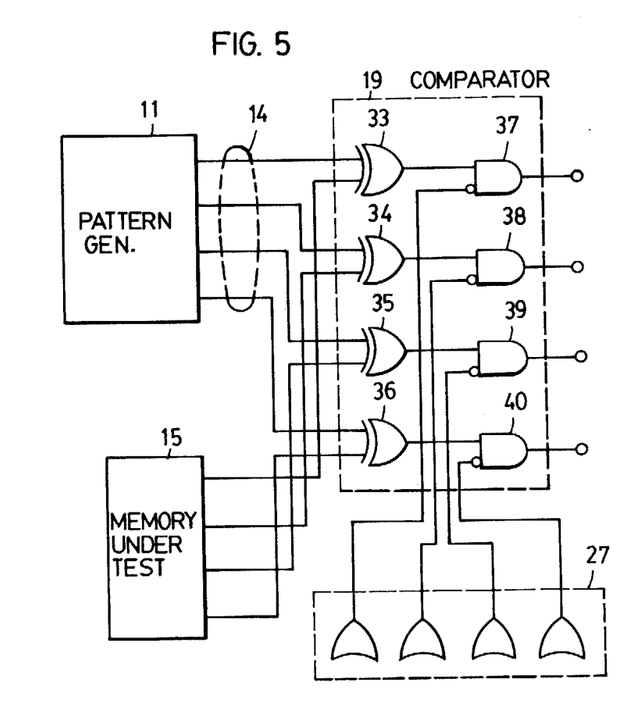
FIG. 5 is a circuit diagram illustrating a specific example of a comparator 19 used in FIG. 2.

FIG. 5 illustrates an example of the arrangement of the comparator 19. The read output from the memory 15 under test is one-word, four-bit in this example and the four bits are respectively applied to exclusive OR circuits 33 to 36. To each of the exclusive OR circuits 33 to 36 are supplied from the terminal 14 one of the corresponding bits of the expected value pattern derived from the pattern generator 11. In each exclusive OR circuit both inputs thereto are compared and only in the case of non-coincidence does the output from the exclusive OR circuit become high-level. The outputs from the exclusive OR circuits 33 to 36 are respectively provided to inhibit gates 37 to 40, which are respectively supplied with corresponding bit outputs from the OR circuit 27 in FIG. 2. In the case where the mask data supplied to the OR circuit 27 are "1" for masking, the output from that one of the inhibit gates 37 to 40 which is supplied with the mask data "1" remains low-level even if the output from that one of the exclusive OR circuits 33 to 36 corresponding to the inhibit gate is high-level. In the case of no masking being performed, the low level "0" is applied to the inhibit gates 37 to 40, permitting the passage therethrough of the data from the exclusive OR circuits 33 to 36. In the case of masking being conducted, that one of the inhibit gates 37 to 40 corresponding to the mask data is closed to inhibit the passage of the data. The outputs from the inhibit gates 37 to 40 are used as the comparison results.

As described above, according to the memory test equipment of the present invention, when one word of the memory under test is composed of a plurality of bits, block masking can be performed selectively for each bit of each word. Consequently, flexible mask data can be generated, permitting an effective defect analysis. It is also possible that by writing in the block mask memory 29 defect data obtained from the comparator 19, the block in which a defect occurs in the next test sequence is masked to thereby reduce the time for defect analysis. By using, as the block mask data of the block mask memory 29, data of one bit for each block in place of the data composed of a plurality of bits respectively corresponding to the bits of each word, it is possible to determine for each block as to whether all its bits are masked or not.

Figure 6:
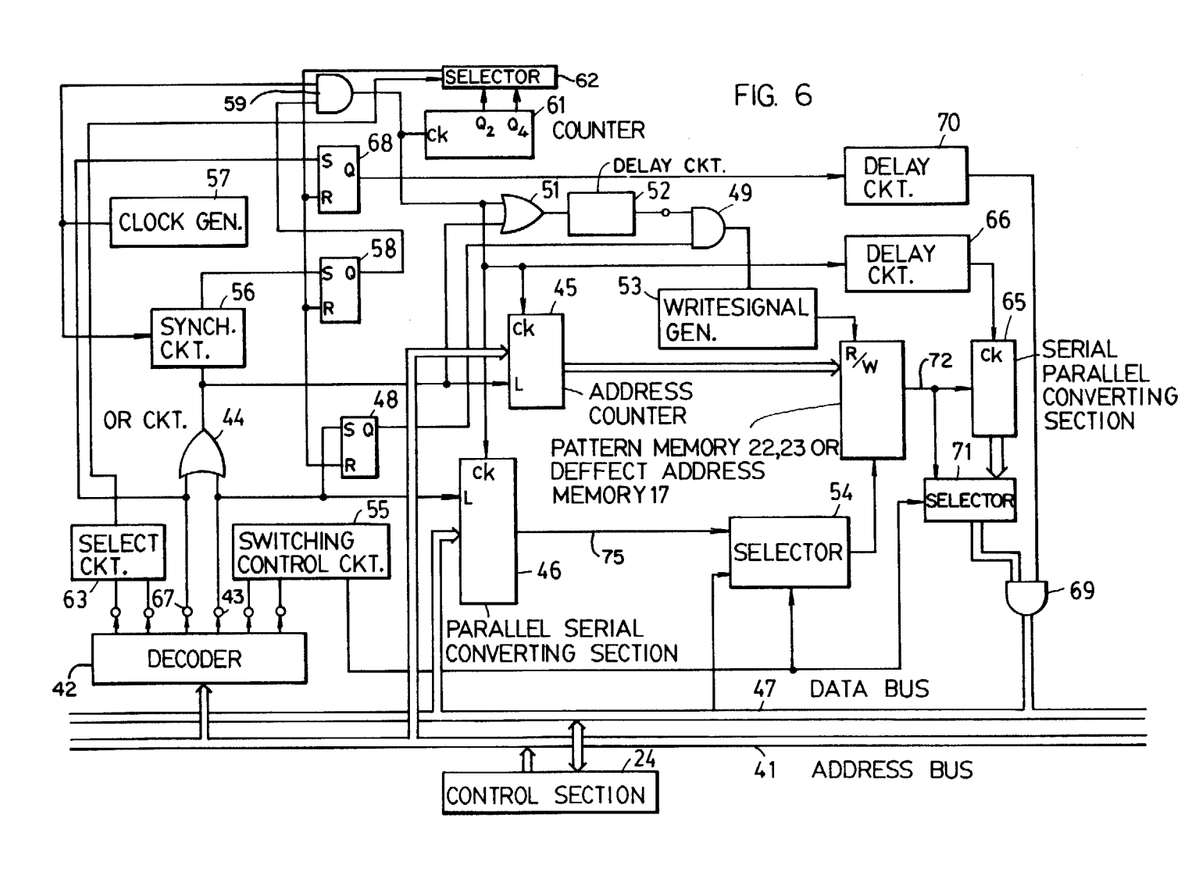
FIG. 6 is a block diagram illustrating the principal part of the semiconductor memory test equipment of the present invention.

FIG. 6 illustrates an example of an arrangement for transferring the expected value pattern or the mask pattern from the control section 24, formed by a central processor, to a corresponding pattern memory, for example, 23 and for inputting the content of the defect address memory 17 to the control section 24. A description will be given first of the case in which the mask pattern is transferred to the mask pattern memory 23. When the control section 24 provides a write command, it is decoded by a decoder 42 to yield a high level at its terminal 43. The high level is applied via an OR circuit 44 to a load terminal L of an address counter 45, presetting therein an address provided on the address bus 41 at that time. The write command and the address set in the counter 45 are provided on different bit lines of the address bus 41. The high level at the terminal 43 is also applied to a load terminal L of a parallel-serial converting section 46, inputting thereto in parallel, for example, 16-bit data provided on a data bus 47 from the control section 24 at that time. By the high level at the terminal 43, a flip-flop 48 is set and its Q output is supplied to an AND gate 49 to open it. The high level output of the OR circuit 44 is applied via an OR circuit 51, a delay circuit 52 and the AND gate 49 to a write signal generator 53 to derive therefrom one write signal, which is applied to a write terminal R/W of the pattern memory 23. The memory 23 is addressed by the content of the address counter 45 to write the output from a selector 54 in the memory 23.

The selector 54 is controlled by a switching signal of a high speed-normal switching circuit 55 to selectively output the output from the parallel-serial converting section 46 or one bit of the data bus 47. The high speed-normal switching circuit 55 is controlled by the control section 24 via the address bus 41 and the decoder 42 so that it is switched between high speed transfer and normal transfer. When the high speed-normal switching circuit 55 is set to the high speed transfer, the selector 54 selects the output from the parallel-serial converting section 46; and when the circuit 55 is set to the normal transfer, the selector 4 selects one bit data on the data bus 47. The parallel-serial converting section 46 is to convert parallel data to serial data and is constituted, for example, by a shift register. The high level outputted from the OR circuit 44 is provided to a synchronizing circuit 56 and then applied to a flip-flop 58 in synchronization with clock pulses from a clock generator 57. By the Q output from the flip-flop 58 an AND gate 59 is opened to pass on the output clock pulses from the clock generator 57 to the OR circuit 51 and to the clock terminals of the counter 45, the shift register 46 and a counter 61. A $Q_2$ or $Q_4$ output from the counter 61 when it counts four or sixteen clock pulses are selected by a selector 62 and the selected output is provided to the flip-flops 48 and 58 to reset them. The selector 62 is controlled by a bit-number select circuit 63, which is set by the control section 24 to a 4-bit or 16-bit mode via the address bus 41 and the decoder 42. The selector 62 selects the $Q_2$ or $Q_4$ output from the counter 61 dependent on whether the bit-number select circuit 63 is set to the 4-bit or 16-bit mode.

Figure 7:
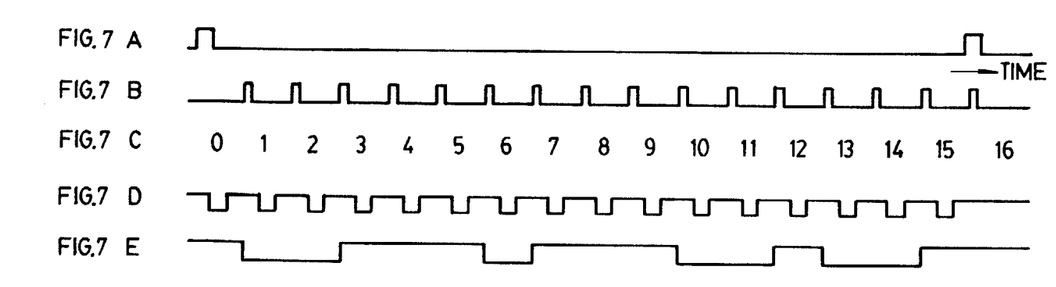
FIGS. 7A to 7E and 8A to 8D are timing charts explanatory of the operation of the test equipment shown in FIG. 5.

The write command is provided on the address bus 41 from the control section 24. When a write command pulse is provided at the terminal 43, as shown in FIG. 7A, clock pulses depicted in FIG. 7B are yielded at the output of the AND gate 59. Since the write command pulse is applied to the OR circuit 51, a write signal which slightly leads the clock pulse of FIG. 7B, as shown in FIG. 7D, is produced by the write signal generator 53 and, upon the fall of the write signal, the write operation of the mask memory 23 is conducted. With the output pulses from the AND gate 59 the address counter 45, for example, increases its content in the order 1, 2, 3, . . . , as illustrated in FIG. 7C. Accordingly, when the content of the address counter 45 is 0, for example, the data selected by the selector 54 at that time, for example, the data shown in FIG. 7E is written in the corresponding parts of the address counter 45 of the pattern memory 23 indicated by the address counter 45.

Upon each occurrence of the write command pulse at the terminal 43, for instance, 16-bit parallel data on the data bus 47 are set in the parallel-serial converting section 46. The data thus set therein are sequentially driven by the clock pulses of FIG. 7B and supplied one by one to the pattern memory 23 via the selector 54. The high speed-normal switching circuit 55 is set to the high-speed transfer and the bit-number select circuit 63 is set to the 16-bit mode. When the counter 61 counts 16 clock pulses, its $Q_4$ output becomes high-level, which output is provided via the selector 62 to the flip-flops 48 and 58 to reset them. As a consequence, the gates 49 and 59 are closed to stop the write operation of the memory 23 and the stepping operations of the counter 45 and the shift register 46.

The circuit arrangement shown in FIG. 6 operates in the manner described above. Accordingly, the pattern data may be provided on the data bus 47 from the control section 24 once for 16 clock pulses yielded by the clock generator 57. Conversely speaking, data can be written in the pattern memory 23 at the rate 16 times higher than the rate of providing the pattern data on the data bus 47 from the control section 24. In other words, the operating speed of the address counter 45 or the pattern memory 23 is usually as high as, for example, approximately 20 nanoseconds, but the speed for directly accessing the pattern memory 23 from the control section 24 or the so-called central processor via the address bus 41 and transferring the pattern data directly to the memory 23 via the data bus 47 is about 1 microsecond. In contrast thereto, the address counter 45 and the pattern memory 23 can be operated at high speed. Accordingly, in the present invention the pattern data can be transferred at high speed as compared with the case of writing each pattern data bit by bit directly in the pattern memory 23 from the control section 24. Also it is possible to change over the selection 54, as required, to directly input the pattern data bit by bit in the pattern memory 23 from the control section 24 as in the prior art. When the data bus 47 used has a 32-bit configuration, the pattern data can be written in the pattern memory 23 at higher speed by simultaneously generating 23 bits of the pattern data from the control section 24 and setting them in the parallel-serial converting section 46 via the data bus 47.

After completion of the test, the content of the defect address memory 17 can be inputted to the control section 24 at high speed by converting the read-out data to parallel data in connection with a plurality of addresses of the defect address memory 17. To perform this, use can be made of one part of the arrangement for the high speed transfer of the pattern data from the control section 24 to the pattern memory 23, as described hereinbelow in respect of FIG. 6. In the inputting of data of the defect address memory, the pattern memory 23 in FIG. 6 is the defect address memory 17. The address counter 45 is provided for accessing the defect address memory 17. The data read out from the defect address memory 17 are loaded in a parallel-serial converting section 65, which is, for instance, a shift register. The data read out from the defect address memory 17 bit by bit are loaded in the shift register 65 while being shifted by the output clocks which are applied via a delay circuit 66 to a clock terminal ck of the shift register 65. When a read command is provided on the address bus 41 from the control section 24, it is decoded by the decoder 42 to yield a high level at a terminal 67. The high level is applied via the OR circuit 44 to the load terminal L of the address counter 45 to preset therein an address provided on the address bus 41 at that time. The high-level output from the OR circuit 44 is also provided via the synchronizing circuit 56 to the flip-flop 58 to set it; consequently, the counter 61 starts to count the clock pulses. The high-level output at the terminal 67 is also supplied to the flip-flop 68 to set it and its Q output is applied via a delay circuit 70 to an AND gate 69 to open it. The parallel data converted by the serial-parallel converting section 65 or the data read out from the defect address memory 17 is selected by a selector 71 and supplied via the gate 69 to the data bus 47 and then inputted to the control section 24 by its operation. The selector 71 is controlled by the output from the high speed-normal switching circuit 55. By the output from the selector 62 the flip-flop 68 is also reset.

Figure 8:
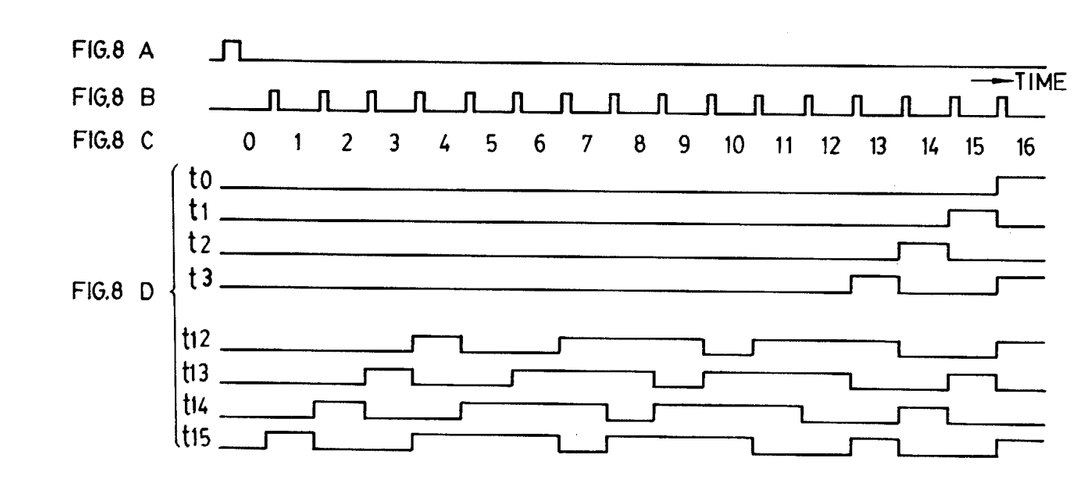

When the read command is provided on the address bus 41 from the control section 24, a read start pulse is applied to the terminal 67, as shown in FIG. 8A, and clock pulses are outputted from the AND gate 59, as depicted in FIG. 8B. As the clock pulses are provided, the content of the address counter 45 changes, for example, in the order 0, 1, 2, 3, . . . , as shown in FIG. 8C, and by each of these addresses the defect address memory 17 is accessed to read out therefrom its stored data. The output data thus read out from the memory 17 are converted by the serial-parallel converting section 65 to parallel data. As a result of this conversion, the data appear in respective shift stages of the shift register 65, for example, as indicated by $t_0$ to $t_{15}$ in FIG. 8D. The data appear in the final stage of the shift register 65 for the first time when the content of the address counter 45 becomes 16, as indicated by $t_0$ in FIG. 8D, and at this time, the contents of the shift register 65 are read out in parallel.

Also in this case, since the defect address memory 17 can be read out at the operating speed of the address counter 45 or the memory 17 at as high a speed as, for example, 20 nano-seconds and since the read-out data are converted by the serial-parallel converting section 65 to parallel data, the inputting of the data by the control section 24 takes place at a speed 1/16 the abovesaid read rate. Accordingly, the inputting speed required of the control section can be markedly reduced as compared with the case where data are inputted for each address. In addition, the contents thus inputted are data in the order of the addresses of the defect address memory 17 and, in the control section 24, the inputted data can immediately be processed for defect analysis. In this example, the data bus 47 is described to have a 16-bit configuration, but when the data bus 47 has a 32-bit configuration, the data can be inputted to the control section 24 after being converted by the serial-parallel converting section 65 to 32-bit parallel data and the speed for inputting the data to the control section 24 can be further lowered.

Figure 9:
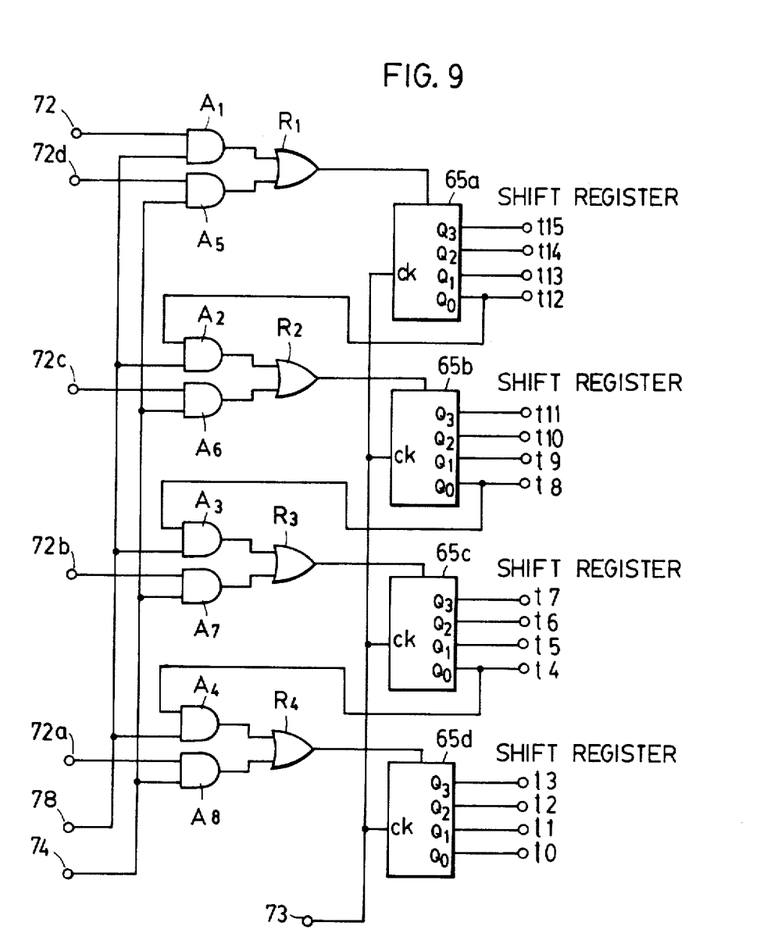
FIG. 9 is a diagram illustrating an example of a serial-parallel converting section for converting selectively one-word, one-bit data and one-word, four-bit data to 16-bit parallel data.

It is also possible to switch the defect address memory 17 between the one-word one-bit mode in which the read output for each address is one bit and the one-word four-bit mode in which four bits are read out for each address and to convert either of the read output by the serial-parallel converting section 65 to 16-bit parallel data. For example, as illustrated in FIG. 9, when each word of the defect address memory 17 is one-bit, a terminal 78 becomes high-level to open AND gates A1, A2, A3 and A4, and the read output from the defect address memory 17 is supplied to the gate A1 from a terminal 72. The outputs from the gates A1, A2, A3 and A4 are provided to data input terminals of shift registers 65a, 65b, 65c and 65d via OR gates R1, R2, R3 and R4, respectively. Accordingly, the shift registers 65a to 65d are each supplied at its clock terminal Ck with the clock pulses via a shift pulse terminal 73, performing a shift operation.

The output read out at the terminal 72 from the defect address memory 17 is read in the shift register 65a via the AND gate A1 and the OR gate R1 and, upon each application of the clock pulse from the terminal 73, advances one by one in the shift register 65a. When the read output inputted to the shift register 65a reaches an output terminal Q0, the output is provided via the AND gate A2 and the OR gate R2 to the shift register 65b of the next stage. The outputs Q0 from the final stages of the shift registers 65b and 65c are respectively applied to the AND gates A3 and A4. Accordingly, after 16 pulses are supplied to the shift pulse terminal 73, the first output read out from the defect address memory 17, with the first of the 16 clock pulses, appears at the terminal Q0 of the final stage of the shift register 65d. When the data of the shift registers 65a to 65d are read out in parallel from output terminals $t_0, t_1, t_2, t_3, \ldots t_{15}$ sequentially numbered in the order of four output terminals Q0, Q1, Q2 and Q3 of each of the shift registers 65d, 65c, 65b and 65a, the 16-bit data thus read out are the contents of the 16-bit data sequentially corresponding to the read out addresses of the defect address memory 17. The 16 bits are simultaneously provided to the data bus 47 via the selector 71 and the gate 61 in FIG. 5.

When the defect address memory 17 has the one-word four-bit configuration, the terminal 78 becomes low-level and the terminal 74 high-level in FIG. 9, by which AND gates A5, A6, A7 and A8 are opened. To the AND gates A8, A7, A6 and A5 are respectively supplied via terminals 72a, 72b, 72c and 72d first, second, third and fourth bits of the output read out from the defect address memory 17. The outputs from the AND gates A5 to A8 are respectively applied to OR gates R1 to R4. Accordingly, the first to fourth bits of one word read out from the defect address memory 17 are provided via the terminals 72a to 72d to the shift registers 65d, 65c, 65b and 65a, respsectively, and when four clock pulses are applied to the terminal 73, the first to fourth bits of each of four words read out from the defect address memory 17 are simultaneously outputted from the shift registers 65d, 65c, 65b and 65a, respectively.

In FIG. 9, the terminals 78 and 74 are controlled by the control of the bit-number select circuit 63 in FIG. 6. That is, when the bit-number select circuit 63 is set to the four-bit data select mode, the selector 62 selects the $Q_2$ output from the counter 61 and when four clock pulses pass through the gate 59 after occurrence of a read command pulse at the terminal 67, the flip-flops 58 and 68 are reset. Whether one word of the defect address memory 17 is one-bit or four-bit, when the serial-parallel converting section 65 is filled with data, that is, after being converted to parallel data, the data are inputted to the control section 24. To perform this, the control section 24 applies a monitor command to the address bus to monitor, for example, the status of the $Q_2$ output from the flip-flop 68 performs the operation of inputting the parallel data upon detection of the completion of the conversion to parallel form.

Figure 10:
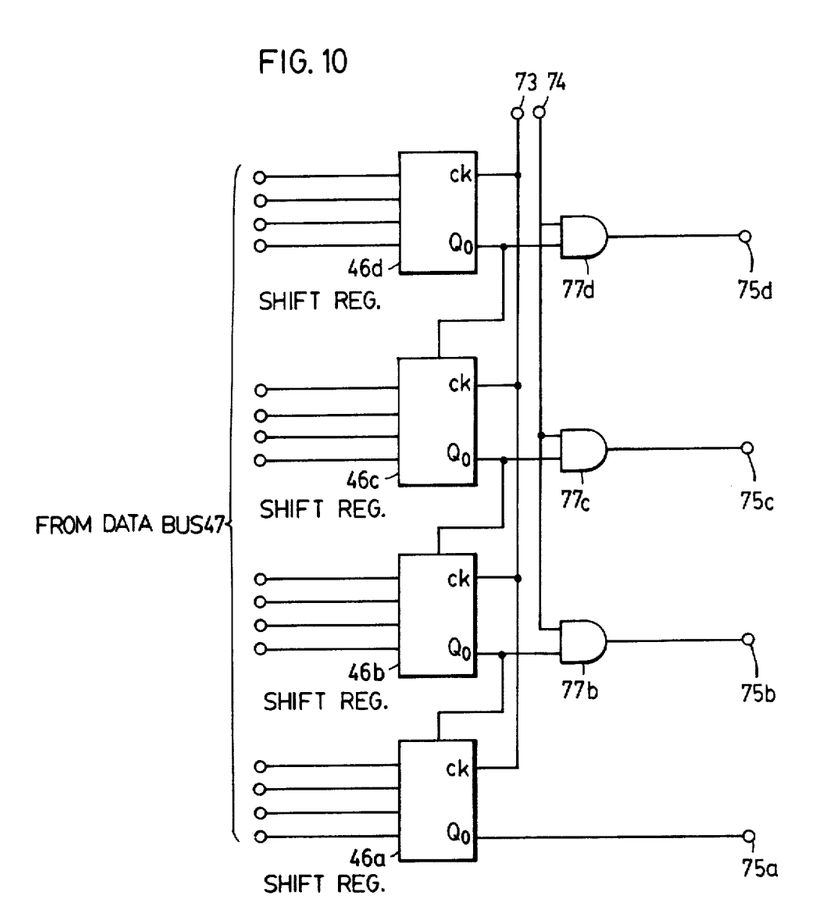
FIG. 10 is a schematic diagram showing an example of a parallel-serial converting section for converting 16-bit parallel data to one-word, one-bit or one-word, four-bit serial data.

Also in the case of writing a pattern in the pattern memory 23 from the control section 24, it is possible to conduct the operation irrespective of whether the data of the pattern memory 23 is the one-word one-bit or one-word four-bit data, by changing over the parallel-serial converting section 46 correspondingly. For instance, as shown in FIG. 10, the 16-bit parallel data from the data bus 47 are simultaneously set in series-connected, four-bit shift registers 46a, 46b, 46c and 46d. In the case of a one-bit per word memory, the shift registers 46a to 46d are controlled to shift by the clock pulses from the terminal 73, and the $Q_O$ output from the shift register 46a is supplied to a terminal 75a. By addressing the pattern memory 23, the data from the terminal 75 are sequentially written therein. In the case where each word of the pattern memory 23 has four bits, the terminal 74 becomes high-level to open AND gates 77b to 77d and the $Q_O$ outputs from the shift registers 46b to 46d are respectively provided to the terminals 75b to 75d via the AND gates 77b to 77d. At this time, the addressing to the pattern memory has not performed the selection of the four memory planes. Consequently, upon each occurrence of the shift clock, the $Q_O$ outputs from the shift registers 46a to 46d are also respectively written via the terminals 75a to 75d into the same addresses of the corresponding memory planes and, by four shift clocks the data in the shift registers 46a to 46d are all written in the pattern memory 23.

It will be apparent that many modifications and variations may be effected without departing from the scope of the novel concepts of this invention.

What is claimed is:

1. An equipment for testing a memory under test, said equipment comprising:
   a pattern generator for generating address data and write data for addressing and selectively writing into each respective generated address of the memory under test, and for providing expected value data in synchronism with the generation of the respective address data by the pattern generator;
   comparator means for comparing data read out from each said respective address of the memory under test with the corresponding expected value data, and for outputting a disagreement signal when the two data are different;

a block mask memory for storing block mask data and for reading same out by a predetermined portion less than the entirety of each said address data generated by said pattern generator for each said respective address of the memory under test;

said comparator means comprising comparison inhibit means for selectively inhibiting said output from the comparator means according to the block mask data read out from the block mask memory;

a defect address memory which is accessed by each said address generated by said pattern generator for the memory under test to selectively write according to the respective block mask data the corresponding output from the comparator means into the respective address of said defect address memory;

wherein said memory under test is divided into plural blocks of plural addresses having a predetermined number of bits per address, and each said block mask data read out by said predetermined portion of each respective address data generated by said pattern generator includes data for selectively inhibiting the output of said disagreement signal to said comparator for each said bit of all the addresses of the corresponding block designated by the block mask data.

2. The equipment of claim 1, including:

a mask memory for storing mask data, said mask memory having a separate address corresponding to each said address of the memory under test; and means for reading out said mask memory by each said generated address from the pattern generator to provide a corresponding output of said mask memory as a predetermined signal to the comparison inhibit means for selectively inhibiting the respective output of said comparator means;

wherein said comparison inhibit means is selectively responsive to said block mask data and said mask data.

3. A memory test equipment comprising:

a pattern generator for generating address data and write data for input to the respective generated addresses of a memory under test, and for providing expected value data in synchromism with the data generation of the pattern generator;

comparator means for comparing data read out from the generated address of the memory under test with the respective expected value data, and for outputting a corresponding disagreement signal when the two data are different;

pattern memory means read out by the generated address from the pattern generator to provide pre-stored pattern memory data corresponding to the respective generated address for input to the comparator means;

clock signal generating means for generating clock pulses for controlling the pre-storing of said pattern memory data in said pattern memory;

an address counter for providing addresses for accessing the pattern memory for said pre-storing of said pattern data by updating the address in said counter from a starting address in synchronism with said clock pulses from the clock signal generating means;

a write signal generator for, in response to a write command, generating write signals in synchronism with said clock pulses to control the pattern memory means for said pre-storing therein of said pattern memory data;

a parallel-to-serial converting section for converting said pattern memory data that is provided as parallel data into serial data for input to the pattern memory in synchronization with said clock pulses;

means for providing a predetermined number of said clock pulses in response to each said write command; and a control section for providing said write command, for supplying said parallel pattern memory data to the parallel-to-serial converting section, and for setting said starting address into the address counter.

4. The equipment of claim 3, said parallel-to-serial converting section comprising means for converting said parallel pattern memory data into plural trains of serial data, each said train of serial data being stored in a respective memory plane of said pattern memory means at the same address, and said predetermined number of clock pulses being selected in accordance with the number of said plural trains and the number of bits of each serial data.

5. The equipment of claim 3 and 4, comprising selective switching means for applying said pattern memory data directly in serial form from the control section to the pattern memory means or for applying said parallel data to the parallel-to-serial converting section for said pre-storing as said serial data in the pattern memory means.

6. The equipment of claim 3 or 4, wherein the pattern memory means comprises an expected value memory for storing the expected value data, and said pattern generator comprising means for providing said generated address data to said pattern memory so that the respective expected value data output from said pattern memory means is provided to said comparator means for said comparison.

7. The equipment of claim 3 or 4, said pattern memory means comprising a mask memory, said pattern memory data corresponding to mask data for selectively inhibiting the respective output of said comparator means for each said generated address, and said comparator means comprising comparison inhibit means for inhibiting said output from the comparator means in accordance with the pattern memory data.

8. A memory test equipment comprising:

a pattern generator for generating address data and write data for input into the respective address of a memory under test corresponding to each said address data, and for providing expected value data in synchronism with the address data generation of the pattern generator;

comparator means for comparing data that is read out from the address of the memory under test corresponding to the respective generated address data with the respective expected value data, and for outputting data corresponding to the result of said comparison;

a defect address memory accessed by each said generated address data for the memory under test to store the respective comparison result of the comparator means as defect address data;

clock signal generating means for generating clock pulses for controlling the reading out of the defect address memory;

an address counter for providing addresses for accessing the defect address memory after each test of said memory under test for reading out the respective defect address data by updating the address in said counter, in synchonism with said clock pulses, from a starting address loaded thereinto in response to a read command;

a serial-to-parallel converting section for converting said read out defect address data for a plurality of addresses consecutively read out from the defect address memory in synchronism with said clock pulses to parallel data;

means for feeding a predetermined number of the clock pulses to the address counter in response to each said read command; and a control section for generating the read command, for receiving the parallel data from the serial-to-parallel converting section, and for setting said starting address in the address counter.

9. The equipment of claim 8, wherein the serial-to-parallel converting section comprises means for converting a predetermined plurality of serial data of a predetermined number of bits into a single parallel data of plural bits.

10. The equipment of claim 8 or 9, comprising switching means for selectively supplying the parallel data from the serial-to-parallel converting section or for serially supplying the output data from the defect address memory to the control section.

11. The equipment of claim 8 or 9 comprising:

pattern memory means read out by each said generated address of the memory under test to provide pattern memory data for input to the comparator means;

said clock pulse generating means also generating clock pulses for writing said pattern memory data into said pattern memory means;

a write signal generator for generating a write signal in synchronism with said clock pulses for writing said pattern memory data into the pattern memory means;

said address counter providing addresses for accessing said pattern memory means before each said test of said memory under test for writing in said pattern memory data by updating the address in said counter, in synchronism with said clock pulses, from a corresponding starting address loaded thereinto in response to a write command;

a parallel-to-serial converting section for converting parallel data to serial data in synchronism with said clock pulses and for supplying the serial data as said pattern memory data to the pattern memory means to be stored as said pattern memory data, corresponding to each respective address in said address counter, and the control section including means for supplying the write command, each said starting address to the address counter, and said parallel data to the parallel-to-serial converting section.

12. The equipment of claim 11, including said comparator means comprising comparison inhibit means for inhibiting said output from the comparator means;

said pattern memory means comprising a mask memory and said pattern memory data being mask data; and means for reading out said mask memory by each said address generated by the pattern generator to provide the corresponding output of said mask memory as a predetermined signal to the comparison inhibit means for selectively inhibiting the respective output of said comparator means for each said generated address.

13. The equipment of claim 11, said pattern memory means comprising an expected value memory for storing expected value data corresponding to each said generated address of the memory under test, said expected value memory being read out by each said address generated by the pattern generator, and each said expected value data being provided to said comparator for said comparison.

14. The equipment of claim 3 or 8, said memory under test comprising plural blocks, with plural addresses in each said block and with each address having a predetermined number of bits, and said equipment comprising a block mask memory for storing block mask data to be read out by a predetermined portion of each generated address data from the pattern generator, and means for selectively inhibiting the output of said comparator means according to the block mask data, wherein said output of said comparator means for each respective bit of all of the addresses of the respective block of said memory under test is selectively inhibited according to the block mask data corresponding to said predetermined portion of the respective address data.

* * * * *